(12) United States Patent
Hasegawa

(10) Patent No.: US 7,876,076 B2
(45) Date of Patent: Jan. 25, 2011

(54) CIRCUIT FOR PREVENTING THROUGH CURRENT IN DC-DC CONVERTER

(75) Inventor: Morihito Hasegawa, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 572 days.

(21) Appl. No.: 11/785,958

(22) Filed: Apr. 23, 2007

(65) Prior Publication Data

US 2007/0285077 A1    Dec. 13, 2007

(30) Foreign Application Priority Data

May 11, 2006  (JP) .............................. 2006-132975

(51) Int. Cl.
*G05F 1/59* (2006.01)
(52) U.S. Cl. ...................... 323/271; 323/283; 323/285; 323/350; 323/351
(58) Field of Classification Search ................. 323/271, 323/282, 283, 285, 350, 351
See application file for complete search history.

(56) References Cited

U.S. PATENT DOCUMENTS

| | | | |
|---|---|---|---|
| 3,579,091 A | | 5/1971 | Clarke |
| 4,349,776 A | | 9/1982 | Federico et al. |
| 5,912,552 A | | 6/1999 | Tateishi |
| 6,307,356 B1 | | 10/2001 | Dwelley |
| 7,456,623 B2 * | | 11/2008 | Hasegawa et al. ........... 323/285 |
| 2007/0080674 A1 * | | 4/2007 | Gray et al. .................. 323/282 |
| 2007/0145961 A1 * | | 6/2007 | Hasegawa et al. ........... 323/282 |
| 2007/0285077 A1 * | | 12/2007 | Hasegawa .................... 323/351 |
| 2008/0067989 A1 * | | 3/2008 | Kasai et al. .................. 323/271 |
| 2008/0136383 A1 * | | 6/2008 | Hasegawa et al. ........... 323/271 |
| 2009/0051339 A1 * | | 2/2009 | Hasegawa et al. ........... 323/285 |

FOREIGN PATENT DOCUMENTS

JP      63-307510      12/1988

(Continued)

OTHER PUBLICATIONS

Leo Francis Cassy, "*Circuit Design for 1-10 MHZ DC-DC Conversion*", Jan. 1989, pp. 67-88, Massachusetts Institute of Technology 1989.

(Continued)

*Primary Examiner*—Jeffrey L Sterrett
(74) *Attorney, Agent, or Firm*—Fujitsu Patent Center

(57) ABSTRACT

A DC-DC converter for preventing through current from causing erroneous operation of an ideal diode. A first transistor for receiving input voltage is connected to an ideal diode, which includes a second transistor and a comparator for detecting current flowing through the second transistor and generating a detection signal. A control circuit generates a switching signal for turning the first transistor on and off so as to keep the output voltage constant. A pulse generation circuit generates a pulse signal for turning off the second transistor before the first transistor is turned on and keeping the second transistor turned off for a predetermined period from when the first transistor is turned on. An erroneous operation prevention circuit generates a control signal for keeping the second transistor turned off from when the second transistor is turned off to when the first transistor is turned on.

15 Claims, 6 Drawing Sheets

FOREIGN PATENT DOCUMENTS

| | | |
|---|---|---|
| JP | 04-042771 | 2/1992 |
| JP | 4-101286 U | 9/1992 |
| JP | 04-128086 | 11/1992 |
| JP | 06-303766 A | 10/1994 |
| JP | 10-225105 A | 8/1998 |

OTHER PUBLICATIONS

"*PFM and PWM synchronous rectification step-down regulator*", 2003, pp. 45-47, vol. 21, No. 5, Fujistu Limited.

"*1-channel PFM and PWM synchronous rectification step-down DC-DC converter IC*", 2004, pp. 28-31, vol. 22, No. 6, Fujitsu Limited.

"Korean Office Action," in corresponding Korean Patent App. No. 10-2007-0043512, mailed on Oct. 12, 2009.

"Taiwanese Office Action," mailed by Taiwanese Patent Office and corresponding to Taiwanese application No. 096113332 on Apr. 29, 2010.

\* cited by examiner

CIRCUIT FOR PREVENTING THROUGH CURRENT IN DC-DC CONVERTER

CROSS-REFERENCE TO RELATED APPLICATIONS

This application is based upon and claims the benefit of priority from the prior Japanese Patent Application No. 2006-132975, filed on May 11, 2006, the entire contents of which are incorporated herein by reference.

BACKGROUND OF THE INVENTION

The present invention relates to a DC-DC converter, and more particularly, to a controller for a DC-DC converter.

In the prior art, electronic devices, such as personal computers, use DC-DC converters as power supplies. Electronic devices are required to reduce power consumption. Accordingly, DC-DC converters are required to reduce power consumption.

In a switching DC-DC converter of the prior art, a first output MOS transistor is turned on so that energy is supplied from its input to its output. The first MOS transistor is turned off so that energy accumulated in an inductor is discharged. When the energy is discharged, the forward voltage of a rectifier diode drops. As a result, some of the energy accumulated in the inductor is lost.

To prevent this, the DC-DC converter includes an ideal diode in lieu of the rectifier diode. The ideal diode includes a second MOS transistor and a comparator, which has an input terminal connected to the source and drain of the second MOS transistor and an output terminal connected to the gate of the second MOS transistor. The comparator detects the current flowing through the inductor based on the voltage drop between the source and drain of the second MOS transistor and turns the second MOS transistor on and off based on the detection result. When current flows from a load to ground via the inductor, the second MOS transistor is turned off in response to an output signal of the comparator. This prevents the efficiency of the DC-DC converter from decreasing in a low load state.

U.S. Pat. No. 4,349,776, Japanese Laid-Open Utility Model Publication No. 04-101286, Japanese Laid-Open Patent Publication No. 06-303766, U.S. Pat. No. 5,912,552, and Japanese Laid-Open Patent Publication No. 10-225105 describe the above structure.

The above structure is also found in Leo Francis Cassy, "CIRCUIT DESIGN FOR 1-10 MHZ DC-DC CONVERSION", Massachusetts Institute of Technology 1989, January 1989, in "PFM and PWM synchronous rectification step-down regulator", FIND, Fujitsu Limited, 2003, Vol. 21, No. 5, pp. 45-47, and in "1-channel PFM and PWM synchronous rectification step-down DC-DC converter IC", FIND, Fujitsu Limited, 2004, Vol. 22, No. 6, pp. 28-31.

SUMMARY OF THE INVENTION

The comparator generates a signal for controlling the second MOS transistor based on the voltage difference between the source and drain of the second MOS transistor when the output first MOS transistor is turned on. If this signal is delayed, the first MOS transistor and the second MOS transistor go on at the same time. In such a case, a large through current flows via the transistors and increases power consumption.

Depending on the load state, after the second MOS transistor is turned off in response to the output signal of the comparator, resonance may occur due to a choke coil and smoothing capacitor connected to the output terminal of the DC-DC converter and cause linking. When linking occurs, current flows from ground to the load. The second MOS transistor in the ideal diode is turned off by an output signal of the comparator generated by the current flowing from the load to ground. However, when current flows from ground to load, the output signal of the comparator turns on the second MOS transistor. In the ideal diode, the second MOS transistor must remain turned off until the first MOS transistor is turned on. However, when linking occurs, the second MOS transistor may go on and cause the ideal diode to function erroneously.

The present invention provides a DC-DC converter and controller for a DC-DC converter that prevent through current from flowing through a transistor forming an ideal diode so that the ideal diode does not function erroneously.

One aspect of the present invention is a DC-DC converter for generating an output voltage from an input voltage. The DC-DC converter includes a first transistor for receiving the input voltage. An ideal diode is connected to the first transistor and includes a second transistor, connected to the first transistor, and a comparator for detecting current flowing through the second transistor and generating a detection signal used to turn the second transistor on and off. A control circuit is connected to the first transistor and generates a first switching signal for turning the first transistor on and off so as to keep the output voltage of the DC-DC converter constant. A pulse generation circuit connected to the ideal diode generates a pulse signal used to turn off the second transistor before the first switching signal turns on the first transistor and to keep the second transistor turned off for a predetermined period from when the first switching signal turns on the first transistor. An erroneous operation prevention circuit is connected to the ideal diode for preventing erroneous operation of the second transistor and generating a control signal used to keep the second transistor turned off from when the detection signal turns off the second transistor to when the first switching signal turns on the first transistor.

A further aspect of the present invention is a controller for incorporation in a DC-DC converter that generates an output voltage from an input voltage and includes a first transistor for receiving the input voltage and an ideal diode connected to the first transistor. The ideal diode has a second transistor connected to the first transistor and a comparator for detecting current flowing through the second transistor to generate a detection signal for turning the second transistor on and off. The controller generating a first switching signal used to turn the first transistor on and off so as to keep the output voltage of the DC-DC converter constant. The controller includes a pulse generation circuit connectable to the ideal diode and generating a pulse signal used to turn off the second transistor before the first switching signal turns on the first transistor and to keep the second transistor turned off for a predetermined period from when the first switching signal turns on the first transistor. An erroneous operation prevention circuit is connectable to the ideal diode for preventing erroneous operation of the second transistor and generating a control signal used to keep the second transistor turned off from when the detection signal turns off the second transistor to when the first switching signal turns on the first transistor.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
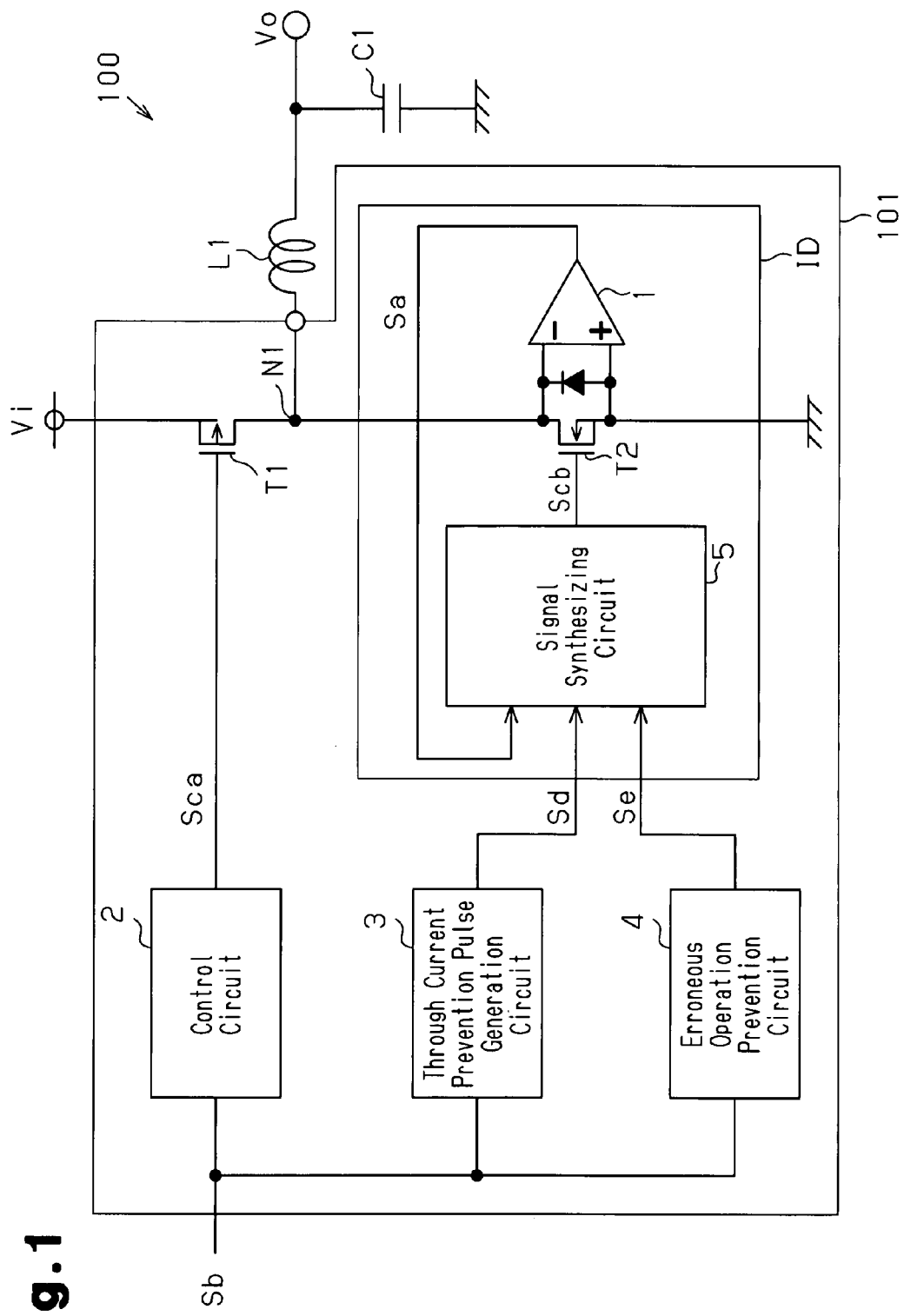
FIG. 1 is a schematic block circuit diagram of a DC-DC converter according to a first embodiment of the present invention.

In the drawings, like numerals are used for like elements throughout.

A first embodiment of the present invention will now be discussed with reference to the drawings.

FIG. 1 is a schematic block diagram of the DC-DC converter 100 of the first embodiment. The DC-DC converter 100 includes a controller 101. The controller 101 includes a first transistor T1 for receiving input voltage Vi, a second transistor T2 connected to the first transistor T1, and a choke coil L1 connected to a node between the first transistor T1 and the second transistor T2. A comparator 1 and a signal synthesizing circuit 5 are connected to the second transistor T2. The comparator 1 detects the current flowing through the second transistor T2, or the choke coil L1, based on the potential difference between the two terminals of the second transistor T2 to generate a detection signal Sa. The signal synthesizing circuit 5 generates a switching control signal Scb for turning the second transistor T2 on and off based on a pulse signal Sd provided from a through current prevention pulse generation circuit 3 and a control signal Se provided from an erroneous operation prevention circuit 4. In the first embodiment, the second transistor T2, the comparator 1, and the signal synthesizing circuit 5 form an ideal diode ID. In the ideal diode ID, there is substantially no forward voltage drop like in a semiconductor diode, and infinite impedance is obtained in the reverse direction. Accordingly, the ideal diode ID has the ideal rectifying characteristics.

A control circuit 2 generates a switching signal Sca for turning on and off the first transistor T1 based on a pulse signal Sb. In response to the switching signal Sca, the first transistor T1 lowers input voltage Vi and generates voltage for node N1. Current corresponding to the voltage at node N1 flows through the choke coil L1 and generates output voltage Vo of the DC-DC converter 100. The control circuit 2 generates the switching signal Sca, which controls the on time and off time of the first transistor T1 so as to maintain the output voltage Vo of the DC-DC converter 100 at a constant value. Based on the pulse signal Sb, the through current prevention pulse generation circuit 3 generates the pulse signal Sd, which turns off the second transistor, during a period before and after the timing at which the first transistor T1 is turned on. As a result, the second transistor T2 is turned off before the first transistor T1 is turned on and remains turned off for a predetermined period from when the first transistor T1 is turned on. The erroneous operation prevention circuit 4 generates a control signal Se that keeps the second transistor T2 off during a period from when the second transistor T2 is turned off to when the first transistor T1 is turned on.

The operation of the DC-DC converter 100 will now be described.

In a state in which the first transistor T1 is on and the second transistor T2 is off, the first transistor T1 is turned off in response to the first switching signal Sca from the control circuit 2. When the first transistor T1 goes off, the energy accumulated in the choke coil L1 is discharged and current flows from ground to an output terminal via a body diode of the second transistor T2. As a result, the comparator 22 generates the signal Sa at a high (H) level. This turns on the second transistor T2. The voltage drop that occurs in the second transistor T2 is small as compared with the forward voltage drop of a diode. As a result, the efficiency of the DC-DC converter 100 is improved.

In a state in which the first transistor T1 is off and the second transistor T2 is on, the first transistor T1 is turned on in response to the first switching signal Sca from the control circuit 2. As a result, the pulse generation circuit 3 generates the one-shot pulse signal Sd, which keeps the second transistor T2 turned off, during a period before and after the timing at which the first transistor T1 goes on as described above. This prevents through current from flowing to ground via the first transistor T1 and the second transistor T2 at the instant the first transistor T1 goes on. Thus, the first and second transistors T1 and T2 are prevented from being simultaneously turned on. When the first transistor T1 is turned on, the potential at the output node N1 increases, and the output of the comparator 1 falls to the L level. Accordingly, the second transistor T2 remains off even when the pulse period of the one-shot pulse signal Sd ends.

When the load is low, the detection signal Sa of the comparator 1 turns off the second transistor T2 before the pulse signal Sd turns off the second transistor T2. Thus, the DC-DC converter 100 is operated in a discontinuous mode (DCM) in which the first transistor T1 and the second transistor T2 are both turned off. In the discontinuous mode, resonance of the choke coil L1 and the smoothing capacitor C1 may cause linking in the level at node N1. When linking occurs, current flows from ground to load. As a result, the detection signal Sa of the comparator 1 switches the second transistor T2 from an off state to an on state. To prevent this, after the detection signal Sa of the comparator 1 turns off the second transistor T2, the erroneous operation prevention circuit 4 generates the control signal Se so as to keep the second transistor T2 off until the control circuit 2 turns on the first transistor T1 based on the pulse signal Sb.

In this manner, in the DC-DC converter 100 of the first embodiment, the ideal diode ID, which is formed by the second transistor T2, the comparator 1, and the signal synthesizing circuit 5, prevents a voltage drop caused by a rectifier. Further, the through current prevention pulse generation circuit 3 generates the one-shot pulse signal Sd that keeps the second transistor T2 turned off in accordance with the timing at which the first transistor T1 is turned on. This prevents through current from flowing through the first and second transistors T1 and T2. Further, when the load is low, after the second transistor T2 is turned off, the erroneous operation prevention circuit 4 keeps the second transistor T2 turned off until the first transistor T1 is turned on. As a result, the second transistor T2 is prevented from being turned on in a manner causing the ideal diode ID to operate erroneously.

A DC-DC converter 10 according to a second embodiment of the present invention will now be described with reference to FIGS. 2 to 7.

Figure 2:
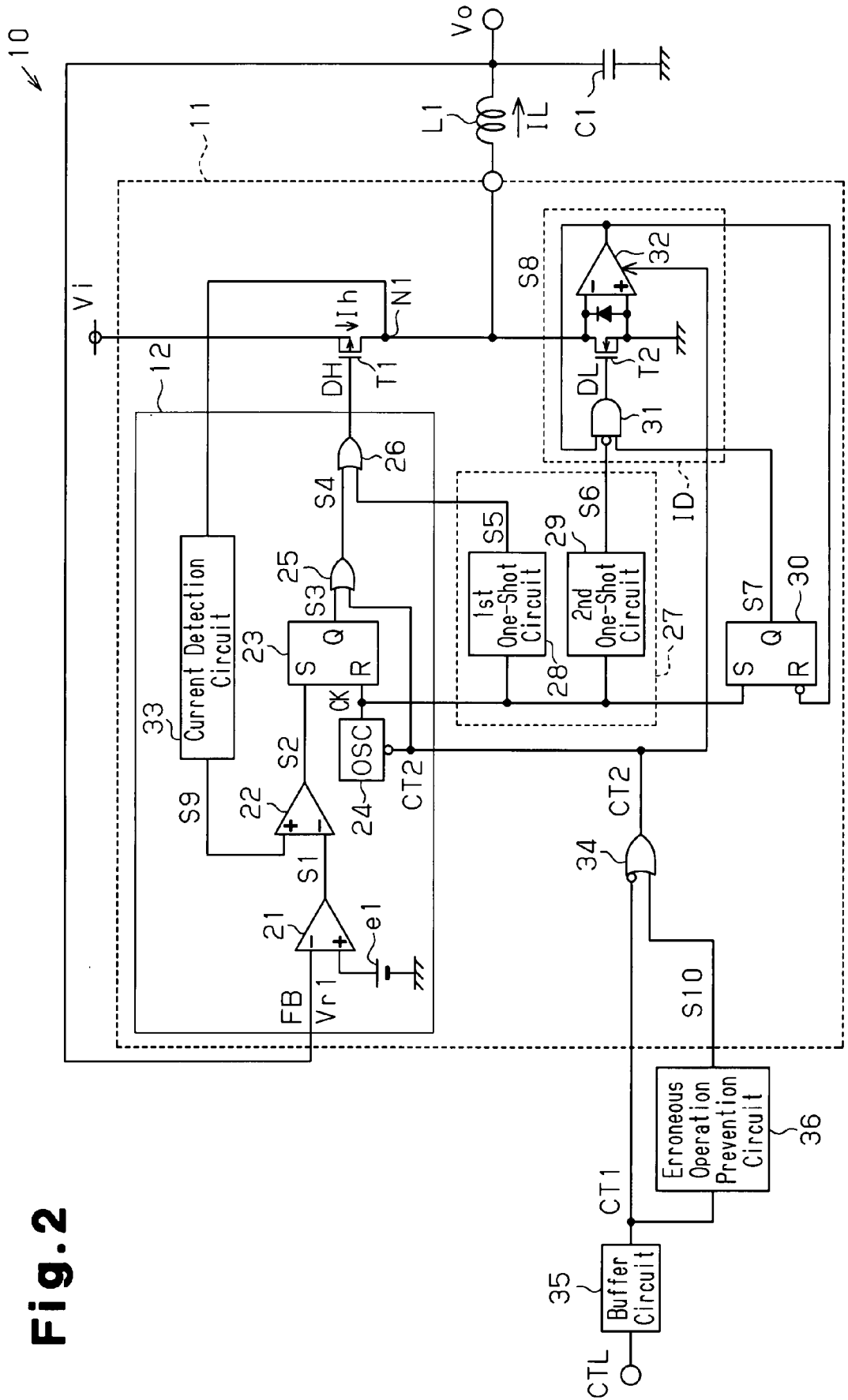
FIG. 2 is a schematic block circuit diagram of a DC-DC converter according to a second embodiment of the present invention.

FIG. 2 is a schematic block circuit diagram showing the DC-DC converter of the second embodiment.

The DC-DC converter 10 lowers an input voltage Vi and generates an output voltage Vo.

The DC-DC converter 10, which is a current controlled DC-DC converter, includes a controller 11, a choke coil L1, and a smoothing capacitor C1. The DC-DC converter 10 stabilizes the output voltage Vo by performing a current mode operation. The controller 11 includes a control circuit 12. The control circuit 12 includes an error amplifier 21, a current comparator 22, a flip-flop circuit 23, an oscillator 24, a current detection circuit 33, a logic gate 25, and a logic gate (driver circuit) 26. In the current mode operation, the error amplifier 21 amplifies the difference between a reference voltage Vr1 and the output voltage Vo. Further, the current comparator 22 compares the amplified voltage with a voltage that is proportional to the current flowing through the choke coil L1. The peak current of the choke coil L1 is controlled based on the comparison result so as to stabilize the output voltage Vo.

A first terminal of the choke coil L1 is connected to an output terminal of the controller 11. A second terminal of the choke coil L1 is connected to a semiconductor integrated circuit device (not shown), which serves as a load. The controller 11 supplies the output voltage Vo to the load via the choke coil L1. The smoothing capacitor C1 is connected to the second terminal of the choke coil L1. The smoothing capacitor C1 smoothes the output voltage Vo. The output voltage Vo is supplied to the controller 11 as a feedback signal FB.

The feedback signal FB is provided to an inversion input terminal of the error amplifier 21. A non-inversion input terminal of the error amplifier 21 is supplied with a reference voltage Vr1 of a reference power supply e1. The error amplifier 21 supplies the voltage of the feedback signal FB, that is, a signal S1 indicating the difference between the output voltage Vo and the reference voltage Vr1 to the current comparator 22.

The current comparator 22 is provided with the output signal S1 of the error amplifier 21 and an output signal S9 of the current detection circuit 33. The current comparator 22 compares the signals S1 and S9 and provides the flip-flop (FF) circuit 23 with a signal S2 having an H level or an L level in accordance with the comparison result.

The FF circuit 23, which is an RS-FF circuit, has a set terminal S provided with the signal S2 and a reset terminal R provided with a clock signal CK having a predetermined cycle. The clock signal CK is generated by the oscillator (OSC) 24. The oscillator 24 is provided with an operation control signal CT2. The oscillator 24 stops operating or starts operating based on the operation control signal CT2. The FF circuit 23 sets a signal S3, which is output from an output terminal Q, in response to an H level signal S2, which is provided to the set terminal S. In other words, the FF circuit 23 generates the signal S3 at an H level in response to an H level signal S2. Further, the FF circuit 23 resets the signal S3 in response to an H level clock signal CK, which is provided to the reset terminal R. In other words, the FF circuit 23 generates the signal S3 at an L level in response to an H level clock signal CK. The OR circuit 25 is provided with the output signal S3 of the FF circuit 23 and the operation control signal CT2. The OR circuit 25, which performs a logical OR operation with the signals S3 and CT2, provides the driver circuit 26 with a signal S4 showing the operation result.

The driver circuit 26 is provided with the output signal S4 of the OR circuit 25 and a first pulse signal S5 of a through current prevention pulse generation circuit 27. The driver circuit 26, which performs a logical OR operation with the signal S4 of the OR circuit 25 and the first pulse signal S5 of the through current prevention pulse generation circuit 27, generates a first control signal DH showing the operation result.

The clock signal CK generated by the oscillator 24 is also provided to the through current prevention pulse generation circuit 27. The through current prevention pulse generation circuit 27 includes a first one-shot circuit 28 and a second one-shot circuit 29. The first one-shot circuit 28 and the second one-shot circuit 29 are provided with the clock signal CK from the OSC 24. The first one-shot circuit 28 generates the first pulse signal S5 having a predetermined pulse width in response to a rising edge of the clock signal CK. The second one-shot circuit 29 generates a second pulse signal S6 having a pulse width differing from that of the first pulse signal S5 in response to a rising edge of the clock signal CK. The pulse width of the first pulse signal S5 and the pulse width of the second pulse signal S6 are each set in accordance with the signal delay time in the controller 11. The pulse width of the second pulse signal S6 is greater than the pulse width of the first pulse signal S5.

The clock signal CK is also provided to a flip-flop circuit (FF circuit) 30, which functions as an error prevention circuit. The FF circuit 30, which is an RS-FF circuit, has a set terminal S provided with the clock signal CK and a reset terminal R provided with a detection signal S8 generated by a comparator 32. The FF circuit 30 generates a control signal S7 based on the clock signal CK and the detection signal S8. In detail, the FF circuit 30 sets the control signal S7, which is output from an output terminal Q, in response to an H level clock signal CK, which is provided to the set terminal S. In other words, the FF circuit 30 generates the control signal S7 at an H level in response to an H level clock signal CK. Further, the FF circuit 30 resets the control signal S7 in response to an L level detection signal S8, which is provided to the reset terminal R. In other words, the FF circuit 30 generates the control signal S7 at an L level in response to an L level clock signal CK. Accordingly, after being provided with the L level detection signal S8, the FF circuit 30 keeps the control signal S7 at an L level until provided with an H level clock signal CK.

The driver circuit 26 provides the first control signal DH to a first output MOS transistor T1, which serves as a first switching element. The first MOS transistor T1, which is formed by a P-channel MOS transistor in the second embodiment, has a gate (control terminal) provided with the first control signal DH, a source provided with the input voltage Vi, and a drain connected to the choke coil L1. The first MOS transistor T1 is turned on in response to an L level first control signal DH and turned off in response to an H level first control signal DH.

A second MOS transistor T2, which serves as a second switching element, is connected to an output node N1 between the first MOS transistor T1 and the choke coil L1. The second MOS transistor T2 is formed, for example, by an N-channel MOS transistor in the second embodiment, and has a drain connected to the first MOS transistor T1, a source connected to ground serving as a second voltage, and a gate connected to an AND circuit 31 serving as a signal synthesizing circuit. Further, the source and drain of the second MOS transistor T2 are connected to a comparator 32. More specifically, the drain of the second MOS transistor T2 is connected to an inversion input terminal of the comparator 32, and the source of the second MOS transistor T2 is connected to a non-inversion input terminal of the comparator 32. The comparator 32 detects the current flowing through the choke coil L1 based on the potentials at the source and drain of the second MOS transistor T2. The comparator 32 generates a detection signal S8 at an H level when current flows from ground to the output terminal (load) and generates the detection signal S8 at an L level when current flows from the output terminal to ground.

The detection signal S8 generated by the comparator 32 is provided to the AND circuit 31. The AND circuit 31 is further provided with the second pulse signal S6 and control signal S7. The AND circuit 31, which performs the logical AND operation with the signals S7 and S8 and an inverted level of the second pulse signal S6, generates a second control signal DL showing the operation result. More specifically, the AND circuit generates the second control signal DL at an H level in response to the H level signals S7 and S8 and the L level pulse signal S6. Further, the AND circuit 31 generates the second control signal DL at an L level when either one of the signals S7 and S8 has an L level or when the pulse signal S6 has an H level. The second control signal DL is provided to the gate (control terminal) of the second MOS transistor T2. The second MOS transistor T2 is turned on when the second control signal DL has an H level and turned off when the second control signal DL has an L level. Accordingly, the second MOS transistor T2 is turned off when at least one of the signals S7 and S8 has an L level or when the pulse signal S6 has an H level.

In the second embodiment, the second MOS transistor T2, the AND circuit 31, and the comparator 32 form an ideal diode ID. Current flows in the forward direction through the ideal diode ID when the forward voltage drop is zero. Further, the impedance of the ideal diode ID is infinite in the reverse direction. Thus, current does not flow through the ideal diode ID in the reverse direction. Accordingly, the ideal diode ID has the ideal rectifying characteristics. The forward voltage of the ideal diode ID does not drop. This reduces the loss of the energy accumulated in the choke coil L1. As a result, the efficiency of the DC-DC converter 10 is prevented from decreasing when the output voltage is low.

The output node N1 is connected to the current detection circuit 33. The current detection circuit 33 detects the current flowing through the choke coil L1 based on the potential at the output node N1 to generate a signal S9 having a voltage that is proportional to the detected current.

The operation control signal CT2 is provided to the oscillator 24 from an OR circuit 34. The OR circuit 34 is provided with an output signal CT1 of a buffer circuit 35, which is operated in accordance with an external control signal CTL. The external control signal CTL is a so-called power down signal for controlling the starting and stopping of the DC-DC converter 10. The output signal CT1 of the buffer circuit 35 is also provided to the erroneous operation prevention circuit 36. The erroneous operation prevention circuit 36 prevents erroneous operation of the DC-DC converter 10 that may occur when the input voltage Vi, which is the power supply voltage, drops instantaneously. The erroneous operation prevention circuit 36 generates a signal S10 when the input voltage Vi decreases to control the output node N1 so that is held at a predetermined level (e.g., an L level) or high impedance. The OR circuit 34 performs the logical OR operation with the signal S10 and an inverted level of the signal CT1 to generate an operation control signal CT2.

The operation control signal CT2 generated by the OR circuit 34 is provided to the comparator 32. The comparator 32 performs operations in a normal state when the operation control signal CT2 has an L level and performs operations in a low power state when the operation control signal CT2 has an H level.

Figure 3:
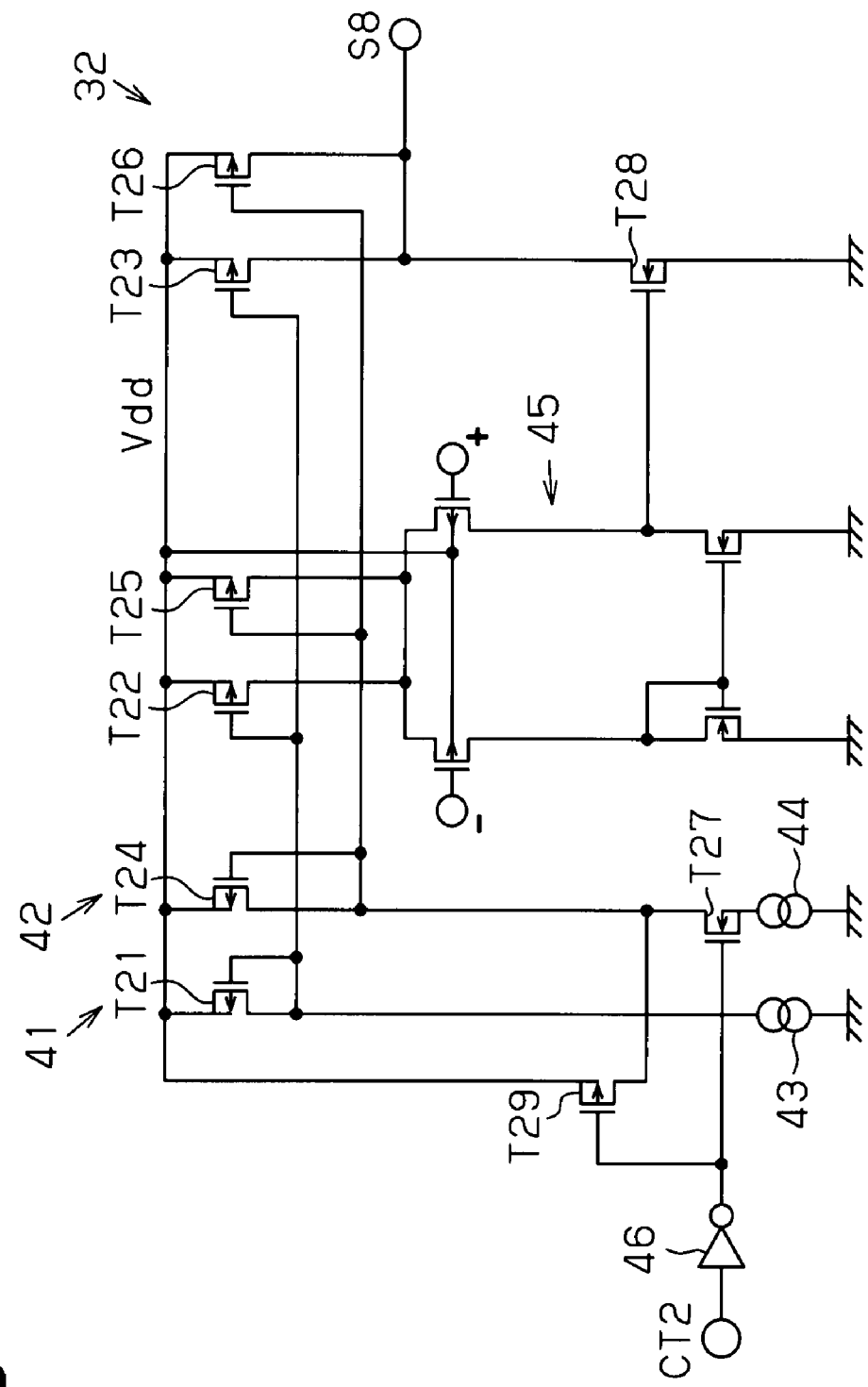
FIG. 3 is a schematic circuit diagram of a comparator shown in FIG. 2.

As shown in FIG. 3, the comparator 32 includes a first current mirror 41 and second current mirror 42, which are each connected to a high potential power supply Vdd. The first current mirror 41 is formed by first to third transistors T21, T22, and T23, and the second current mirror 42 is formed by fourth to sixth transistors T24, T25, and T26. The drain of the first transistor T21 is connected to a first constant current source 43. The drain of the fourth transistor T24 is connected to a second constant current source 44 via a seventh transistor T27 formed by an N-channel MOS transistor. The fourth to sixth transistors T24, T25, and T26 each have a gate connected to the drain of the seventh transistor T27. The second transistor T22 and fifth transistor T25 each have a drain connected to a differential amplifier 45. The third transistor T23 and sixth transistor T26 each have a drain connected to an output eighth transistor T28. A ninth transistor T29 formed by a P-channel MOS transistor is connected between the source and gate of each of the fourth to sixth transistors T24, T25, and T26. The seventh transistor T27 and the ninth transistor T29 each have a gate provided with an output signal of an inverter 46, which generates an inverted signal of the operation control signal CT2.

In the above structure, when the operation control signal CT2 has an L level, in response to an H level output signal from the inverter 46, the seventh transistor T27 is turned on, and the ninth transistor T29 is turned off. This connects the second current mirror 42 to the second constant current source 44. Accordingly, the differential amplifier 45 and the output eighth transistor T28 are each supplied with current from the first constant current source 43 and current from the second constant current source 44.

When the operation control signal CT2 has an H level, in response to an L level output signal from the inverter 46, the seventh transistor T27 is turned off, and the ninth transistor T29 is turned on. This disconnects the second current mirror 42 from the second constant current source 44. Further, the source and gate are short-circuited in each of the transistors T24, T25, and T26 forming the second current mirror 42. Accordingly, the differential amplifier 45 and the output eighth transistor T28 are each supplied with current from the first constant current source 43.

The operation control signal CT2 is held at an H level when performing operations in a low power state and held at an L level when performing operations in a normal state. Accordingly, when performing operations in a low power state, the current flowing through the comparator 32 is reduced to about one half of that used when performing operations in a normal state. Thus, when performing operations in the low power state, the comparator 32 consumes current that is about one half of that used when performing operations in a normal state, while maintaining the output level by supplying the differential amplifier 45 and the output transistor T28 with an appropriate amount of current. This structure reduces the current consumed by the controller 11. Comparator operations may be suspended to reduce the current consumption. However, it is preferable that a comparator be driven by a slight current (e.g., current that is one half of that consumed during operations in a normal state) during a low power state. This would improve the response to the comparator 32 when shifting operations from a lower power state to a normal state in comparison to when suspending operation of the comparator.

The operation of the DC-DC converter 10 with the above-described structure will now be described.

Figure 4:
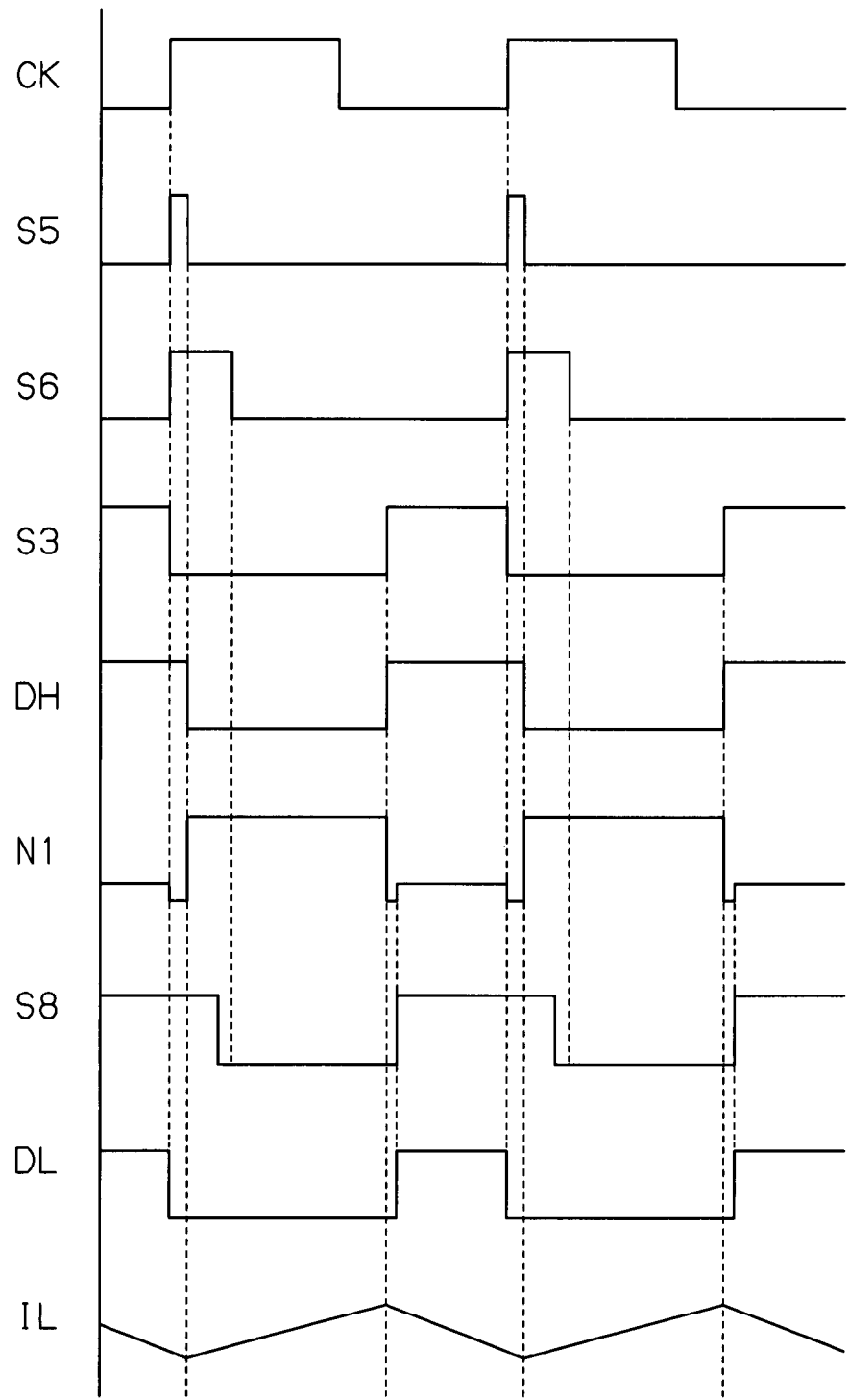
FIG. 4 is a schematic operational waveform diagram of the DC-DC converter in a continuous mode.
Figure 5:
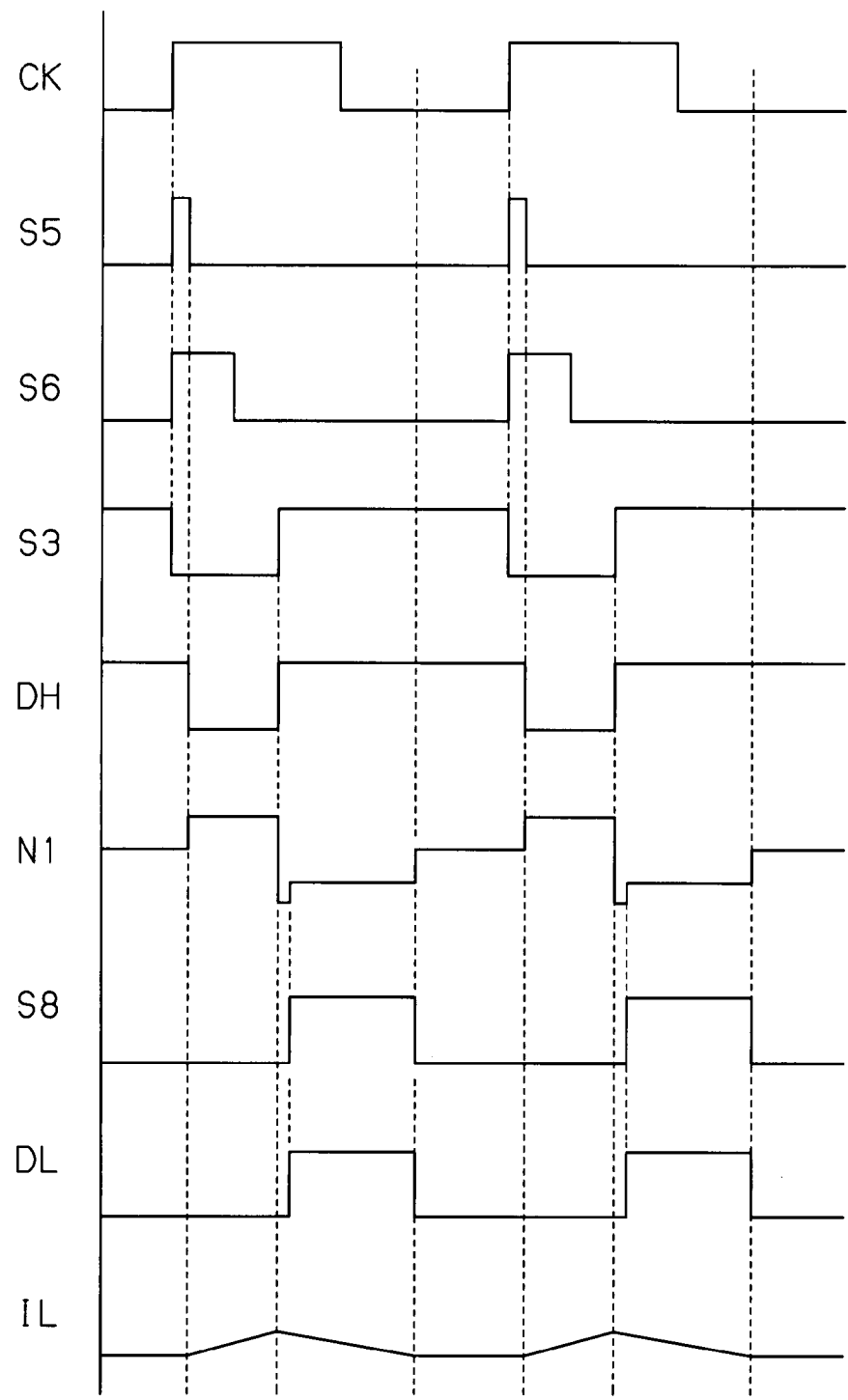
FIG. 5 is a schematic operational waveform diagram of the DC-DC converter in a discontinuous mode.

FIG. 4 is a schematic operational waveform diagram of the DC-DC converter 10 in a continuous mode. FIG. 5 is a schematic operational waveform diagram of the DC-DC converter 10 in a discontinuous mode.

The operation of the through current prevention pulse generation circuit 27 will first be described.

The first output MOS transistor T1 is turned on in response to an L level first control signal DH and turned off in response to an H level first control signal DH. The falling edge of the first control signal DH is delayed from the rising edge of the clock signal CK, for example, as shown in FIG. 4, by the time corresponding to a first pulse width of the first pulse signal S5. Thus, the first MOS transistor T1 is turned on at a timing delayed from the rising edge of the clock signal CK by the time corresponding to the first pulse width. In other words, the controller 11 turns on the first MOS transistor T1 in predetermined cycles based on the cycle of the clock signal CK provided from the oscillator 24.

When the first MOS transistor T1 is turned on, the current flowing through the choke coil L1 increases and the voltage of the output signal S9 generated by the current detection circuit 33 increases. When the voltage of the output signal S9 generated by the current detection circuit 33 becomes higher than the voltage of the output signal S1 generated by the error amplifier 21, the set terminal S of the FF circuit 23 is provided with an H level signal S2. In response to the H level signal S2, the output signal S3 of the FF circuit 23 is set to an H level. As a result, the first output MOS transistor T1 is turned off, and the energy accumulated in the choke coil L1 is discharged.

As described above, if the output voltage Vo decreases when the first MOS transistor T1 is on, the voltage of the output signal S1 generated by the error amplifier 21 increases. This lengthens the time taken by the output signal S2 of the current comparator 22 to rise to an H level. As a result, the on-time of the first MOS transistor T1 increases. When the output voltage Vo increases, the voltage of the output signal S1 generated by the error amplifier 21 decreases. This shortens the time taken by the output signal S2 of the current comparator 22 to rise to an H level. As a result, the on-time of the first MOS transistor T1 decreases. With this operation, the first MOS transistor T1, which has been turned on in predetermined cycles based on the output signal frequency (i.e., clock frequency) of the oscillator 24, is turned off in accordance with the amount of the output current IL. The controller 11 determines the timing at which the first MOS transistor T1 is turned off based on level of the output voltage Vo. This keeps the output voltage Vo constant.

As shown in FIGS. 4 and 5, the first one-shot circuit 28 generates the first pulse signal S5 having the first pulse width in response to a rising edge of the clock signal CK. The second one-shot circuit 29 generates the second pulse signal S6 having the second pulse width in response to the rising edge of the clock signal CK.

The FF circuit 23 generates an L level signal S3 in response to a rising edge of the clock signal CK and generates an H level signal S3 based on the signal S2 that shifts in accordance with the output voltage Vo. The OR circuit 25 generates the signal S4 at substantially the same level as the signal S3 in response to an L level operation control signal CT2. As a result, the pulse width of the L level signal S3 (S4) and the pulse width of the H level signal S3 (S4) change in accordance with level of the output voltage Vo.

The driver circuit 26 generates a first control signal DH by performing a logical OR operation with the first pulse signal S5 and the signal S4. The signal S4, or the signal S3, falls to an L level when the clock signal CK rises. The first pulse signal S5 is maintained at an H level for the time corresponding to the first pulse width from when the pulse signal S5 rises. As a result, the first control signal DH falls at the timing delayed from the falling edge of the signal S4, or signal S3, by the time corresponding to the first pulse width. In other words, the first one-shot circuit 28 and the driver circuit 26 delay the fall of the output signal S3 of the FF circuit 23 by the time corresponding to the first pulse width.

The second one-shot circuit 29 generates the second pulse signal S6 having the second pulse width in response to rise of the clock signal CK. Thus, the AND circuit 31 generates an L level control signal DL during the period in which the second pulse signal S6 has an H level. The second MOS transistor T2 is turned off in response to the L level control signal DL. In other words, the second MOS transistor T2 remains off for at least the time corresponding to the second pulse width after the second pulse signal S6, or the clock signal CK, rises. As a result, the first MOS transistor T1 and the second MOS transistor T2 are both off for the time corresponding to the first pulse width after the clock signal CK rises. The second pulse width is greater than the first pulse width. Thus, even after the first MOS transistor T1 is turned on, the second MOS transistor T2 remains in the off state due to the L level control signal DL.

When the first MOS transistor T1 is turned on, the input voltage Vi causes the potential at the output node N1 to increase. Thus, the comparator 32 generates an L level detection signal S8 while the first MOS transistor T1 is on. Thus, even after the second pulse signal S6 falls to an L level, the second MOS transistor T2 remains in the off state due to the L level output signal S7 provided from the comparator 32.

In the conventional circuit that does not include the through current prevention pulse generation circuit 27, an extremely large through current Ih flows through the first MOS transistor T1 when the first MOS transistor T1 is turned on. The current Ih delays the increase of the potential at the output node N1 and delays the timing at which the control signal DL, which is provided to the gate of the second MOS transistor T2, falls to an L level. As a result, the through current Ih continues to flow until the second MOS transistor T2 is turned off. In the DC-DC converter 10 of the second embodiment, during the period before and after the first MOS transistor T1 is turned on, the second MOS transistor T2 is turned off by the second pulse signal S6. This prevents a through current from flowing. More specifically, the second MOS transistor T2 is turned off before the first MOS transistor T1 is turned off by an L level control signal DH. Afterwards, the second MOS transistor T2 remains off for a predetermined period from when the first MOS transistor T1 is turned on by an H level control signal DH. This prevents through current from flowing. In other words, a large current is prevented from flowing through the first MOS transistor T1.

For example, the input voltage Vi is 5.0 V, the output voltage Vo is 1.2 V, the operational frequency is 2.0 MHz, and the current to be supplied to the load is 600 mA. In such a case, when a through current flows for 10 nsec and the amount of the through current is 4.2 A, a loss caused by the through current is 420 mW. The conversion efficiency of the entire DC-DC converter is 50% when such a through current flows.

The efficiency η1 of the switching regulator (i.e., DC-DC converter 10) is expressed as the ratio of the output power to the input power.

η1=output power/input power

The output power is obtained by multiplying the output voltage Vo by the output current IL. The input power is obtained by multiplying the input voltage Vi by the input current Ii. The above expression is transformed as shown below.

η1=(Vo*IL)/(Vi*Ii)

The loss LA of the entire switching regulator is the difference between the input power and the output power. The input power is expressed using the loss LA as shown below.

(Vi*Ii)=(Vo*IL)+LA

As a result, the efficiency η1 of the switching regulator is expressed as shown below.

η1=(Vo*IL)/(Vo*IL+LA)

The loss LA of the entire DC-DC converter is calculated using the above values as shown below.

0.5=(1.2 V*600 mA)/(1.2 V*600 mA+LA)

LA=720 mW

Without loss caused by a through current, the loss of the entire DC-DC converter is calculated as shown below.

720 mW−420 mW=300 mW

As a result, the conversion efficiency of the DC-DC converter in this case is calculated as shown below.

(1.2 V*600 mA)/(1.2 V*600 mA+300 mW)=70.6%.

In this way, by preventing the flow of a through current, the conversion efficiency of the DC-DC converter 10 is improved from 50% to 70.6%.

When the first MOS transistor T1 is turned off, the energy accumulated in the choke coil L1 is discharged so that the voltage at the output node N1 becomes a negative voltage. Thus, the comparator 32 generates an H level detection signal S8. In this state, the signal S6 is held at an L level. Thus, the AND circuit 31 generates an H level control signal DL. As a result, the second MOS transistor T2 is turned on. The H level detection signal S8 generated by the comparator 32 includes a delay. The delay is generated after the first MOS transistor T1 is turned off. More specifically, the signal S8 rises to an H level after a predetermined time elapses from when the first MOS transistor T1 is turned off. Thus, the second MOS transistor T2 is turned on after the first MOS transistor T1 is turned off. In other words, the second MOS transistor T2 is turned on while the first MOS transistor T1 and the second MOS transistor T2 are both off.

As described above, the second MOS transistor T2 operates as the ideal diode ID. This reduces voltage drop in the second MOS transistor T2 as compared with a voltage drop that occurs in a semiconductor diode and reduces the loss of the energy accumulated in the choke coil L1. As a result, the conversion efficiency of the DC-DC converter 10 is improved. Further, the second MOS transistor T2 is turned off when the first MOS transistor T1 is switched between on and off. Thus, the MOS transistors T1 and T2 are not on at the same time. This prevents a through current from flowing through the MOS transistors T1 and T2.

The operation of the error prevention circuit (FF 30) will now be discussed.

Figure 6:
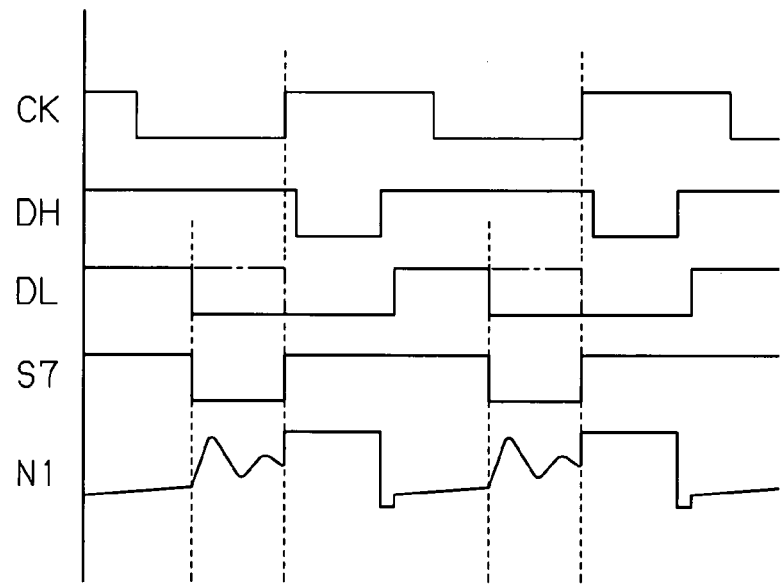
FIG. 6 is a schematic operational waveform diagram of the DC-DC converter when the load is low.

When the load is low, referring to FIG. 6, the first MOS transistor T1 switches from on to off within a short period in response to the first control signal DH. When the first MOS transistor T1 goes off, the potential at the output node N1 decreases to a negative potential, and the detection signal S8 of the comparator 32 rises to an H level. As a result, the second control signal DL rises to an H level, and the second MOS transistor T2 is turned on. When the second MOS transistor T2 is turned on, the potential at the output node N1 gradually increases. As the potential at the output node N1 reaches a predetermined potential, and current flows from the output terminal (load) to ground, the detection signal S8 of the comparator 32 falls to an L level. Thus, the second control signal DL falls to an L level and turns off the second MOS transistor T2. Accordingly, current is prevented from flowing from the output terminal to ground. This prevents energy loss.

In response to the L level detection signal S8, the FF circuit 30 generates an L level control signal S7. Further, the FF circuit 30 generates an H level control signal S7 in response to an H level clock signal CK. Accordingly, the FF circuit 30 maintains the control signal S7 at an L level from when the control signal S8 falls to an L level until when the clock signal CK rises to an H level. In other words, the FF circuit maintains the control signal S7 at an L level from when the second MOS transistor T2 is turned off to when the next cycle starts to turn on the first MOS transistor T1. Accordingly, the second MOS transistor T2 remains off during the period in which the control signal S7 remains at an L level. Thus, even when linking occurs in the voltage level at node N1 due to resonance caused by the choke coil L1 and the smoothing capacitor C1, the second MOS transistor T2 is maintained in an off state. In other words, the ideal diode ID is maintained in a disconnected state. This prevents erroneous operations that may occur when resonance causes the ideal diode ID to become conductive.

Figure 7:
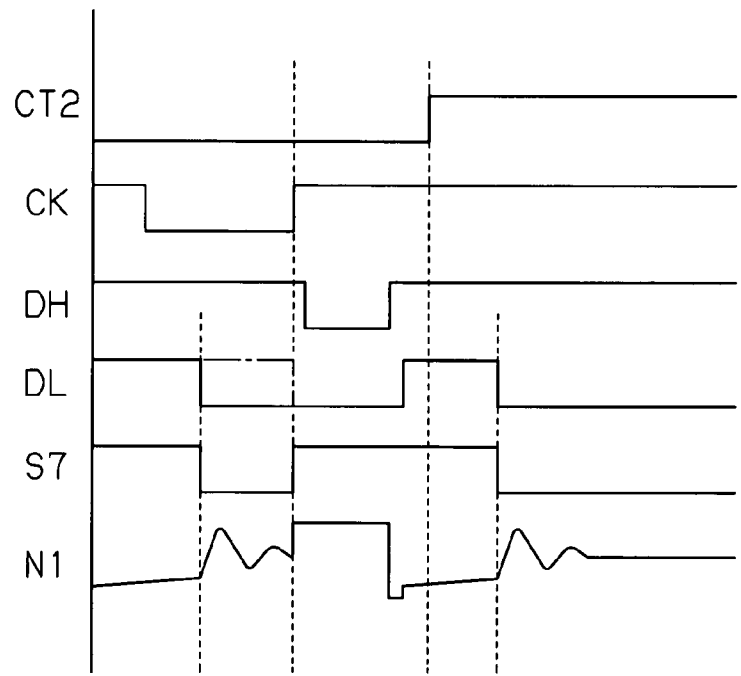
FIG. 7 is a schematic operational waveform diagram of the DC-DC converter when an oscillator shown in FIG. 2 stops operating.

As shown in FIG. 7, when the external control signal CTL causes the operation control signal CT2 to rise to an H level, the oscillator 24 shown in FIG. 2 suspends oscillation, the first control signal DH is maintained at an H level, and the first MOS transistor T1 is maintained in an off state. As a result, in the same manner as described above, current flows from the output terminal (load) to ground after a predetermined period elapses from when the second MOS transistor T2 is turned on. As a result, the comparator 32 generates an L level detection signal S8, and the second MOS transistor T2 is turned off. Then, the FF circuit 30 generates an L level control signal S7 in response to the L level detection signal S8, and the AND circuit 31 generates an L level second control signal DL in response to the L level control signal S7. Accordingly, the L level second control signal DL maintains the second MOS transistor T2 in an off state. Thus, even if resonance of the choke coil L1 and the smoothing capacitor C1 causes linking to occur in the voltage level at node N1, the second MOS transistor T2 remains off regardless of the linking shifting the level of the detection signal S8. This maintains the ideal diode ID in a disconnected state. Accordingly, the ideal diode ID is prevented from being erroneously operated when the second MOS transistor T2 is turned on by resonance.

The DC-DC converter 10 of the second embodiment has the advantages described below.

(1) The comparator 32 detects the current flowing through the choke coil L1 based on the potential difference between the source and drain terminals of the second MOS transistor T2. Then, the comparator 32 generates the detection signal S8 to turn off the second MOS transistor T2 in accordance with the detection result. The second MOS transistor T2 and the comparator 32 form the ideal diode ID. This reduces voltage drop as compared with the voltage drop that occurs in a semiconductor diode. Accordingly, the loss of the energy accumulated in the choke coil L1 is reduced, and the conversion efficiency of the DC-DC converter 10 is improved.

(2) The controller 11, which includes the through current prevention pulse generation circuit 27 for generating a pulse signal based on the clock signal CK of the oscillator 24, turns off the second MOS transistor T2 in the period before and after the first MOS transistor T1 goes on. As a result, the first MOS transistor T1 and the second MOS transistor T2 are not on at the same time. This prevents through current from flowing.

(3) The comparator 32 generates an L level detection signal S8 when detecting the flow if current from the load to ground. The FF circuit 30 keeps the second MOS transistor T2 in an off state from when the detection signal S8 falls to an L level to when the clock signal CK rises next to turn on the first MOS transistor T1. Thus, even if resonance of the choke coil L1 and the smoothing capacitor C1 causes linking to occur in the voltage level at node N1, the second MOS transistor T2 remains off regardless of the linking shifting the level of the detection signal S8. This maintains the ideal diode ID in a disconnected state. Accordingly, the ideal diode ID is prevented from being erroneously operated by resonance.

It should be apparent to those skilled in the art that the present invention may be embodied in many other specific forms without departing from the spirit or scope of the invention. Particularly, it should be understood that the present invention may be embodied in the following forms.

The erroneous operation prevention circuit is not limited to the FF circuit 30. The erroneous operation prevention circuit is formed to maintain the second MOS transistor T2 in an off state from when the comparator 32 detects the flow of current from the load to ground to when the first MOS transistor T1 goes on next in response to an H level clock signal CK.

The FF circuit 30 may set the control signal S7 with a signal other than the clock signal CK. For example, the FF circuit 30 may set the control signal S7 with the output signal S3 of the FF circuit 23, the output signal S4 of the OR circuit 25, or the first control signal DH.

In the comparator 32, instead of changing the current amount by disconnecting the second current mirror 42 and the second constant current source 44, two constant current sources may be switched to change the current amount.

An offset may be set for the comparator forming the ideal diode ID. That is, the potential for the input signal (inversion input terminal or non-inversion input terminal) of the comparator 32 may be varied to shift the level of the output signal S8. Further, such an offset voltage may be variable.

The present invention is not limited to a current controlled DC-DC converter and may be applied to a voltage controlled DC-DC converter. Further, the present invention is not limited to a DC-DC converter that generates an output voltage Vo by lowering the input voltage Vi and may be applied to a DC-DC converter that generates an output voltage Vo by increasing the input voltage Vi.

The DC-DC converter 10 and the controller 11 of the DC-DC converter 10 may be formed as a single-chip semiconductor or as a module, such as a printed circuit board. The DC-DC converter 10 and controller 11 may be used as a power supply device incorporated in an electronics device.

The present examples and embodiments are to be considered as illustrative and not restrictive, and the invention is not to be limited to the details given herein, but may be modified within the scope and equivalence of the appended claims.

What is claimed is:

1. A DC-DC converter comprising:
    a first transistor supplied with a first voltage;
    a second transistor coupled to the first transistor;
    a comparator which is coupled to the second transistor and detects current flowing through the second transistor;
    a first control circuit coupled to the first transistor and generating a first control signal for turning the first transistor on and off so as to keep an output voltage of the DC-DC converter;
    a second control circuit which turns the second transistor off in accordance with the output of the comparator and generates a second control signal used to keep the second transistor turned off until the first transistor is turned on;
    a pulse generation circuit which generates a pulse signal; and
    a signal synthesizing circuit which generates a control signal, based on the output of the comparator, the pulse signal, and the second control signal, to turn the second transistor on and off.

2. The DC-DC converter according to claim 1, further comprising:
    a choke coil coupled to a node between the first transistor and the second transistor; and
    a smoothing capacitor coupled to the choke coil and smoothing the output voltage of the DC-DC converter.

3. The DC-DC converter according to claim 1, wherein the comparator is provided with an operation control signal for switching an operation state of the comparator, wherein the operation control signal is generated based on an external control signal such that the current flowing through the comparator that is in a first operation state by the operation control signal is less than the current flowing through the comparator that is in a second operation state by the operation control signal.

4. The DC-DC converter according to claim 1, further comprising:
    a third control circuit which holds a node between the first transistor and the second transistor at a predetermined level or high impedance when the first voltage decreases.

5. The DC-DC converter according to claim 1, wherein the second control circuit includes:
    a flip-flop circuit which sets the second control signal at a first level by the output of the comparator and sets the second control signal at a second level in synchronism with a clock signal having a predetermined cycle.

6. The DC-DC converter according to claim 1, wherein:
    the first control circuit generates the first control signal in accordance with a clock signal having a predetermined cycle; the DC-DC converter further comprising:
    a pulse generation circuit which generates a pulse signal in accordance with the clock signal.

7. The DC-DC converter according to claim 6, wherein the first control circuit includes:
    a flip-flop circuit which generates a logic signal used to turn on the first transistor in synchronism with the clock signal.

8. The DC-DC converter according to claim 6, wherein the first control circuit includes:
    an oscillator which generates the clock signal, the oscillator starting or stopping operation in response to an operation control signal that is generated based on an external control signal.

9. The DC-DC converter according to claim 6, wherein the pulse generation circuit includes:
    a first one-shot circuit which generates a first pulse signal in accordance with the clock signal to turn off the first transistor during a period corresponding to a first pulse width; and a second one-shot circuit which generates a second pulse signal in accordance with the clock signal to turn off the second transistor during a period corresponding to a second pulse width that is greater than the first pulse width.

10. A controller for incorporation in a DC-DC converter that includes a first transistor supplied with a first voltage, a second transistor coupled to the first transistor, and a comparator which is coupled to the second transistor and detects current flowing through the second transistor, the controller comprising:

a first control circuit which is coupled to the first transistor and generates a first control signal used to turn the first transistor on and off so as to keep an output voltage of the DC-DC converter;

a second control circuit which turns the second transistor off in accordance with the output of the comparator and generates a second control signal used to keep the second transistor turned off until the first transistor is turned on;

a pulse generation circuit which generates a pulse signal; and a signal synthesizing circuit which generates a control signal, based on the output of the comparator, the pulse signal, and the second control signal, to turn the second transistor on and off.

11. The controller according to claim 10, wherein the DC-DC converter further includes:

a choke coil coupled to a node between the first transistor and the second transistor; and a smoothing capacitor coupled to the choke coil and smoothing the output voltage of the DC-DC converter.

12. The controller according to claim 10, wherein the second control circuit includes:

a flip-flop circuit which sets the second control signal at a first level by the output of the comparator and sets the second control signal at a second level in synchronism with a clock signal having a predetermined cycle.

13. The controller according to claim 10, wherein the first control signal is generated in accordance with a clock signal having a predetermined cycle, the controller further comprising:

a pulse generation circuit which generates a pulse signal in accordance with the clock signal.

14. The controller according to claim 13, wherein the pulse generation circuit includes:

a first one-shot circuit which generates a first pulse signal in accordance with the clock signal to turn off the first transistor during a period corresponding to a first pulse width; and a second one-shot circuit which generates a second one-shot pulse signal in accordance with the clock signal to turn off the second transistor during a period corresponding to a second pulse width that is greater than the first pulse width.

15. The controller according to claim 13, further comprising:

a flip-flop circuit which generates a logic signal used to turn on the first transistor in synchronism with the clock signal.

* * * * *